(12) United States Patent
Boek et al.

(10) Patent No.: US 10,497,898 B2
(45) Date of Patent: Dec. 3, 2019

(54) SEALED DEVICE HOUSING WITH PARTICLE FILM-INITIATED LOW THICKNESS LASER WELD AND RELATED METHODS

(71) Applicant: CORNING INCORPORATED, Corning, NY (US)

(72) Inventors: Heather Debra Boek, Corning, NY (US); Theresa Chang, Painted Post, NY (US); Leonard Charles Dabich, II, Painted Post, NY (US); Mark Alan Lewis, Horseheads, NY (US); Stephan Lvovich Logunov, Corning, NY (US); Mark Alejandro Quesada, Horseheads, NY (US); Wageesha Senaratne, Horseheads, NY (US); Alexander Mikhailovich Streltsov, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/778,333

(22) PCT Filed: Nov. 22, 2016

(86) PCT No.: PCT/US2016/063221
§ 371 (c)(1),
(2) Date: May 23, 2018

(87) PCT Pub. No.: WO2017/091527
PCT Pub. Date: Jun. 1, 2017

(65) Prior Publication Data
US 2018/0351130 A1 Dec. 6, 2018

Related U.S. Application Data

(60) Provisional application No. 62/259,433, filed on Nov. 24, 2015.

(51) Int. Cl.
*H01L 51/52* (2006.01)
*H01L 51/56* (2006.01)
(Continued)

(52) U.S. Cl.
CPC .......... *H01L 51/5246* (2013.01); *B23K 26/24* (2013.01); *C03C 8/02* (2013.01);
(Continued)

(58) Field of Classification Search
None
See application file for complete search history.

(56) References Cited

U.S. PATENT DOCUMENTS 6,831,029 B2  12/2004 Chaco et al.
7,602,121 B2  10/2009 Aitken et al.
(Continued)

OTHER PUBLICATIONS

International Search Report and Written Opinion Fo The International Searching Authority; PCT/US2016/063221; dated March 8, 2017; 15 Pages; Korean Intellectual Property Office.
(Continued)

*Primary Examiner* — Shaun M Campbell
(74) *Attorney, Agent, or Firm* — Russell S. Magaziner; Ryan T. Hardee

(57) ABSTRACT

A laser weldable device housing substrate, device housing and related method are provided. The substrate includes a first surface, a second surface opposite the first surface, and a thin inorganic particle layer supported by the first surface. The inorganic particle layer includes a plurality of particles arranged in a layer on the first surface. The particles have an average diameter of less than or equal to 1.0 μm, and the inorganic particle layer has an average thickness of less than or equal to 5 μm.

19 Claims, 7 Drawing Sheets

(51) Int. Cl.
*B23K 26/24* (2014.01)
*C03C 8/02* (2006.01)
*C03C 8/24* (2006.01)

(52) U.S. Cl.
CPC ................ *C03C 8/24* (2013.01); *H01L 51/56* (2013.01); *C03C 2205/00* (2013.01)

(56) References Cited

U.S. PATENT DOCUMENTS

| | | |
|---|---|---|
| 7,829,147 B2 | 11/2010 | Aitken et al. |
| 8,299,705 B2 | 10/2012 | Choi |
| 9,469,562 B2 | 10/2016 | Masuda et al. |
| 9,515,286 B2 | 12/2016 | Dabich, II et al. |
| 2001/0018124 A1 | 8/2001 | Yamakawa et al. |
| 2002/0128141 A1 | 9/2002 | Buhrmaster et al. |
| 2004/0206953 A1 | 10/2004 | Morena et al. |
| 2004/0207314 A1 | 10/2004 | Aitken et al. |
| 2009/0206738 A1* | 8/2009 | Koo .................... H01L 51/524 313/504 |
| 2011/0278553 A1 | 11/2011 | Kwon et al. |
| 2012/0228644 A1 | 9/2012 | Hunze et al. |
| 2013/0115460 A1 | 5/2013 | Yamada |
| 2013/0213852 A1* | 8/2013 | Yamazaki ................ C03C 8/08 206/701 |
| 2013/0333748 A1 | 12/2013 | Naito et al. |
| 2014/0151742 A1 | 6/2014 | Logunov et al. |
| 2014/0196502 A1* | 7/2014 | Masuda .................... C03C 3/14 65/32.2 |
| 2015/0027168 A1 | 1/2015 | Dabich, II et al. |
| 2015/0266772 A1* | 9/2015 | Mitsui ...................... C03C 8/24 428/76 |
| 2016/0347644 A1 | 12/2016 | Dabich, II et al. |
| 2017/0050881 A1* | 2/2017 | Abdolvand ............ B23K 26/32 |
| 2018/0138446 A1 | 5/2018 | Dabich, II et al. |

OTHER PUBLICATIONS

English Translation of CN201680068870.X Office Action dated July 22, 2019; 12 Pages; Chinese Patent Office.

* cited by examiner

SEALED DEVICE HOUSING WITH PARTICLE FILM-INITIATED LOW THICKNESS LASER WELD AND RELATED METHODS

CROSS-REFERENCE TO RELATED APPLICATIONS

This application claims the benefit of priority under 35 U.S.C. § 371 of International Patent Application Serial No. PCT/US2016/063221, filed on Nov. 22, 2016, which in turn, claims the benefit of priority of U.S. Provisional Patent Application Ser. No. 62/259,433 filed on Nov. 24, 2015, the contents of each of which are relied upon and incorporated herein by reference in their entireties.

BACKGROUND

The disclosure relates generally to a sealed electronic device housing and specifically to hermetically sealed, glass or glass-ceramic structures for electronic devices, such as organic LEDs (OLEDs), quantum dot devices, etc. In general, hermetic sealing of some devices, such as OLED display devices, is needed to provide barriers against materials, such as water and oxygen. Typical frit sealing is used to adhesively bond together two substrates around the electronic device, and such frit seals typically have a relatively large thickness.

SUMMARY

One embodiment of the disclosure relates to a laser weldable device housing substrate. The substrate includes a first surface, a second surface opposite the first surface, and a thin inorganic particle layer supported by the first surface. The inorganic particle layer includes a plurality of particles arranged in a layer on the first surface. The particles have an average diameter of less than or equal to 1.0 μm, and the inorganic particle layer has an average thickness of less than or equal to 5 μm.

An additional embodiment of the disclosure relates to a sealed electronic device housing. The sealed electronic device housing includes a first substrate having a first surface, a second substrate having a second surface facing the first surface, and an inorganic particle-initiated laser weld joining the first surface to the second surface. The laser weld surrounds a chamber defined between the first substrate, the second substrate and the laser weld. The laser weld has a maximum thickness of less than 5 μm and is formed from materials of the first and second substrates joined together An additional embodiment of the disclosure relates to a method of forming a hermetically laser sealable device housing. The method includes providing a first substrate having a first surface and applying an inorganic particle layer to the first surface. The inorganic particle layer includes a plurality of particles arranged in a layer on the first surface. The particles have an average diameter of less than 1.5 μm and the inorganic particle layer has an average thickness of less than 5 μm. The particles are at least one of a glass material and an inorganic material.

Additional features and advantages will be set forth in the detailed description that follows, and, in part, will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding and are incorporated in and constitute a part of this specification. The drawings illustrate one or more embodiment(s), and together with the description serve to explain principles and the operation of the various embodiments.

DETAILED DESCRIPTION

Referring generally to the figures, various embodiments of a sealed electronic device, such as a sealed OLED device, and related methods are shown and described. In general, the sealed electronic device discussed herein includes two opposing substrates (e.g., glass sheet substrates) within a chamber, recess or cell formed between the two substrates, and an active component or device, such as an OLED, quantum dot, etc., located within the chamber. A particle-initiated weld surrounds the chamber, hermetically sealing the active component within the chamber. In specific embodiments, the particle-initiated weld is a laser weld formed by portions of the first and second substrates that are joined together using laser energy. A thin, low-particle size particle layer is applied to the substrate at the desired location of the weld, and the material of the particle layer absorbs the laser energy causing the material of the substrates to cohesively bond together (e.g., through viscoelastic swelling together of substrate material) forming the particle-initiated weld. In general, the particle-initiated laser welds discussed herein are cohesive structures which form a strong and hermetic seal around the chamber.

Further, as discussed herein, Applicant has developed various methods for preparing a small particle solution that allows the particle layer to be formed utilizing printing or other application techniques to deposit the particle material to the substrates in the pattern desired to form the weld. As will be understood, sealing of conventional electronic devices that utilize conventional frit-based sealing is based on adhesive bonding between the frit and the adjacent substrate materials, and such conventional processes typically form adhesive welds having a thickness of at least 5 μm and a tensile strength of less than 10 MPa. In contrast to the conventional frit sealed devices, the laser-welded electronic devices discussed herein provide cohesive, particle-initiated, laser welds having low thickness and high weld strength as compared to conventional frit sealed devices. Further, in contrast to conventional frit sealing techniques, the device and method of the present disclosure do not require coefficient of thermal expansion matching between the particle material and the substrates due to the cohesive nature of the weld bond formed and the very low particle layer thickness. In addition, the methods of preparing and applying the low thickness particle layer discussed herein are believed to provide advantages (e.g., efficiency, printing accuracy, etc.) relative to vacuum-based, thin-film deposition techniques.

Figure 1:
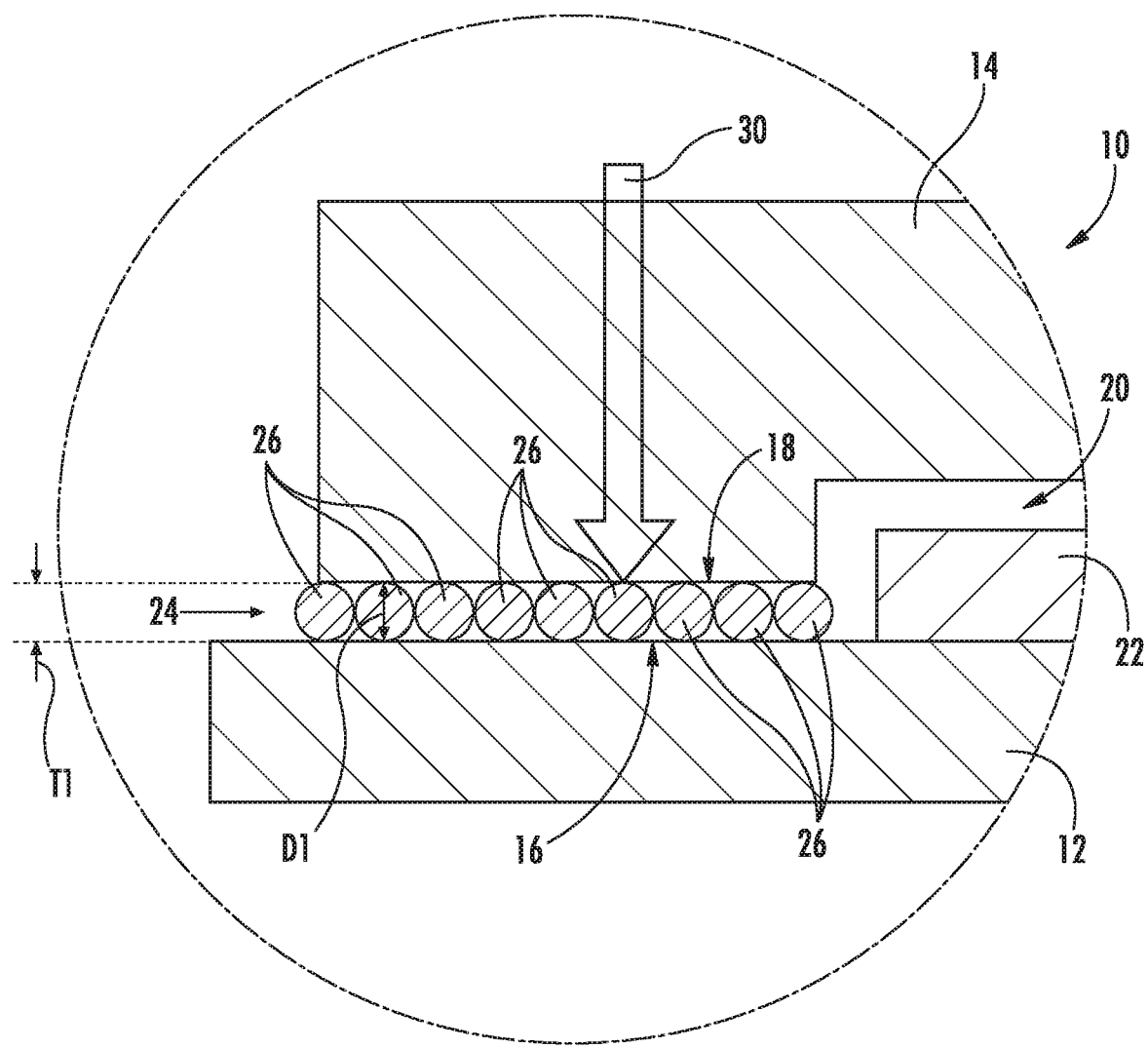
FIG. 1 shows a side cross-sectional view of a sealable device housing including a thin particle layer according to an exemplary embodiment.

Referring generally to FIG. 1, an electronic device and housing, such as device 10, is shown prior to formation of the particle-initiated weld. In general, device 10 includes first and second substrates, shown as bottom substrate 12 and upper substrate 14. Bottom substrate 12 includes a first surface, shown as upper surface 16, facing a second surface, shown as lower surface 18, of upper substrate 14. In general, substrates 12 and 14 are sheets of a glass material (e.g., soda-lime glass, Gorilla® glass sheet material available from Corning, Inc., Eagle XG® glass sheet material available from Corning, Inc., etc.). In the arrangement shown, upper surface 16 and lower surface 18 are major surfaces of the substrates.

As shown in FIG. 1, when upper substrate 14 is located on lower substrate 12, a chamber 20 is defined between a portion of the lower surface 18 of upper substrate 14 and a portion of the upper surface 16 of lower substrate 12. Chamber 20 includes a space within which an active component, such as an active device 22, is located. While FIG. 1 shows chamber 20 as substantially rectangular in cross-sectional shape, chamber 20 may be any suitable shape for containing an active device 22, including various curved or dome shapes.

In various embodiments, active device 22 may be a variety of electronic devices, such as an organic electronic device, an organic-inorganic hybrid electronic device, and an inorganic electronic device. In various embodiments, active device 22 may be various semi-conductor devices, photovoltaic devices, LEDs, organic LEDs, MEMs, fluorophores, alkali metal electrodes, transparent conducting oxides and quantum dots. In such embodiments, device 10 may be any of a wide variety of devices utilizing such electronic components. In various embodiments, device 10 may be a lighting device, a TV display, a monitor, a mobile device display, an electrochromic window, vacuum insulated glass devices, etc. In various embodiments, the hermetic encapsulation of an active component using the materials and methods disclosed here can facilitate long-lived operation of devices otherwise sensitive to degradation by oxygen and/or moisture.

As shown in FIG. 1, prior to formation of a weld or seal, device 10 includes a thin particle layer 24. Particle layer 24 is located between portions of substrates 12 and 14 and is located at the position at which a laser weld is to be formed. Specifically, particle layer 24 may be applied to and supported by at least one of surfaces 16 and 18 of substrates 12 and 14, respectively, in a manner that particle layer 24 surrounds chamber 20 such that the subsequently formed laser weld also surrounds and seals chamber 20.

Particle layer 24 is formed from a structured and arranged layer of small diameter particles, shown as particles 26. As described in more detail below, particles 26 may be any organic material particles capable of forming a layer that absorbs laser energy, such as ultraviolet UV energy. In a specific embodiment, particle layer 24 is formed from a monolayer of particles 26, and in other embodiments, particle layer 24 includes multiple layers of particles 26. For example, in other embodiments, particle layer 24 may be an aggregate layer formed from particles 26 (e.g., see FIG. 2B).

In contrast to standard frit-layers used for conventional frit seal formation, Applicant has develop a process for forming and applying very low diameter particles in a particle layer having a low thickness. In specific embodiments, the particle layer is a laser absorbing particle layer and is specifically an ultraviolet absorbing layer. Because the particle layer discussed herein may be applied using a printing technique (rather than a thin film deposition technique, for example), the particle layer may be applied quickly and efficiently. The low particle size and layer thickness is believed to facilitate the particle layer's ability to absorb laser energy during welding, and in specific embodiments, the absorption of laser energy in turn causes the substrate materials to viscoelastically swell into each other, forming a cohesive bond between the substrate rather than the generally weaker adhesive bonding common with thicker conventional frit seals.

In various embodiments, particles 26 of particle layer 24 have an average particle diameter (or maximum width dimension), shown as D1, of less than or equal to 1.5 µm, and specifically of less than or equal to 1.0 µm. In specific embodiments, D1 is between 1.0 nm and 1.5 µm, inclusive, specifically, between 3.0 nm and 1.5 µm, inclusive, and more specifically between 3.0 nm and 1.0 µm, inclusive. Because of the low particle size and organized particle arrangement within particle layer 24, the average thickness of particle layer 24, shown as T1, is also low in the monolayer morphology shown in FIG. 1. In specific embodiments, T1 is less than or equal to 5 µm, and more specifically less than 1.5 µm. In specific embodiments, T1 is between 1.5 nm and 5 µm, inclusive, specifically between 3 nm and 1.5 µm, inclusive, and more specifically 50 nm and 1.5 µm, inclusive. In the aggregate morphology (e.g., shown in FIG. 2B), smaller particle aggregates can themselves form larger aggregates culminating in a thicker dense film suitable for laser welding.

Further, in specific embodiments and in contrast to standard frit materials, the material of particle layer 24 has a coefficient of thermal expansion (CTE) that is substantially different than the CTEs of the substrate materials. In this structure, CTE-mismatch is effectively irrelevant due to the low thickness of particle layer 24 and the cohesive nature of the weld bond formed, particle layer 24 forms a very strong weld despite the difference in CTEs. In particular, in specific embodiments, particle layer 24 does not utilize the addition of negative CTE materials in order to provide CTE matching between the material of the particle layer and the substrates, as is conventionally understood to be required in standard frit welding. In specific embodiments, the material of substrates 12 and 14 has a first CTE, CTE1, and the material of particle layer 24 has a second CTE, CTE2. In various embodiments, the difference between CTE2 and CTE1 is at least 0.001%, specifically 1% and more specifically at least 5%. In various embodiments, CTE1 is between $0.3 \times 10^{-6}/^\circ$ C. and $20 \times 10^{-6}/^\circ$ C., and CTE2 is between $0.3 \times 10^{-6}/^\circ$ C. and $20 \times 10^{-6}/^\circ$ C. In other exemplary embodiments, the CTE of particle layer 24 and the substrates may be the same or substantially the same, such as when the difference between CTE2 and CTE1 is less than 5%.

Figure 2A:
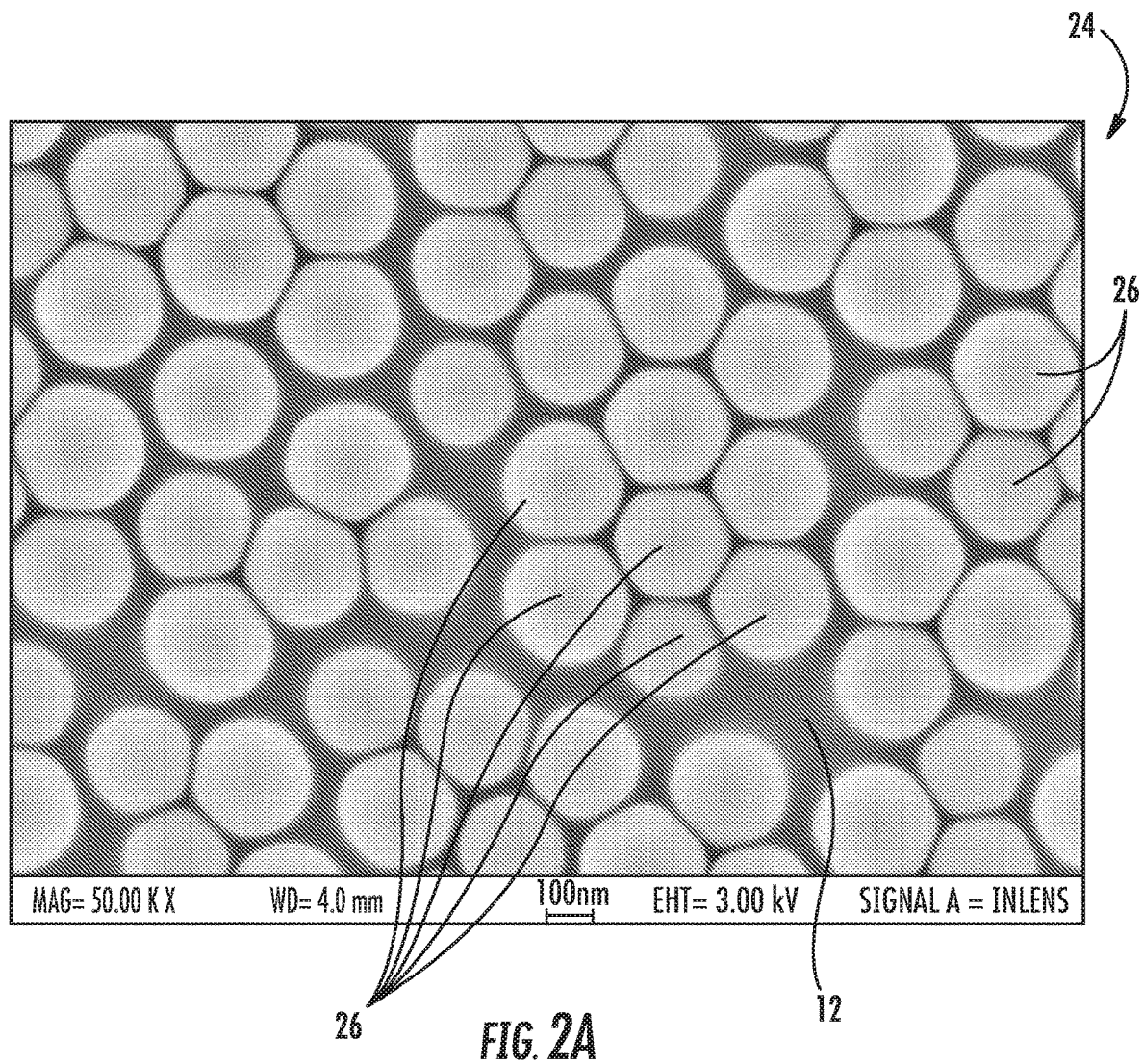
FIG. 2A shows an image of a substantially hexagonal close-packed particle layer according to an exemplary embodiment.

As discussed in more detail below, in various embodiments, particle layer 24 includes a surfactant material coupled to or associated with particles 26. The surfactant material facilitates formation of a particle suspension or dispersion fluid that is suitable for application onto substrate 12 and/or 14 via a printing method, a dip-coating method, spin coating method, etc. In certain ("monolayer morphology") embodiments, the surfactant material facilitates the formation of an orderly particle arrangement within particle layer 24. In specific embodiments, particles 26 form a substantially hexagonal close-packed arrangement on the substrate, an example of which is shown in FIG. 2A. In particular embodiments, the packing density of particles in the monolayer shown in FIG. 2A can be defined in relation to the highest potential packing density for spherical objects, lattice packing, which is about 74.048% packing density. Therefore, the packing density within the particle layer may be defined by the deviation from this perfect 2D planar packing as anything less than 74% packing density, specifically less 60% packing density, and more specifically less than 55% packing density, etc. In specific embodiments, the packing density within the particle layer may be between 40%-74% packing density, specifically 50%-74% packing density and more specifically 60%-74% packing density. In various embodiments, the surfactants are anionic, cationic, zwitterionic or nonionic surfactant materials. In a particular embodiment, the surfactant is cetyl trimethylammonium chloride (CTAC) but other suitable surfactants may be used.

In various embodiments, the particle layer 24 may have gaps, and does not necessarily need to be a tight packed arrangement. In various embodiments layer 24 may have gaps provided that sufficient laser energy is absorbed in the radiated area. For example, in one embodiment, a round beam laser of 200-20 um diameter has absorption greater 15-20%, which is believed to be a sufficient level of absorption to form the seal. In various embodiments, the gaps within layer 24 can be between 1-10 times the particle size, or between 80-90% of the radiated area, and still provide sufficient laser absorption.

Figure 2B:
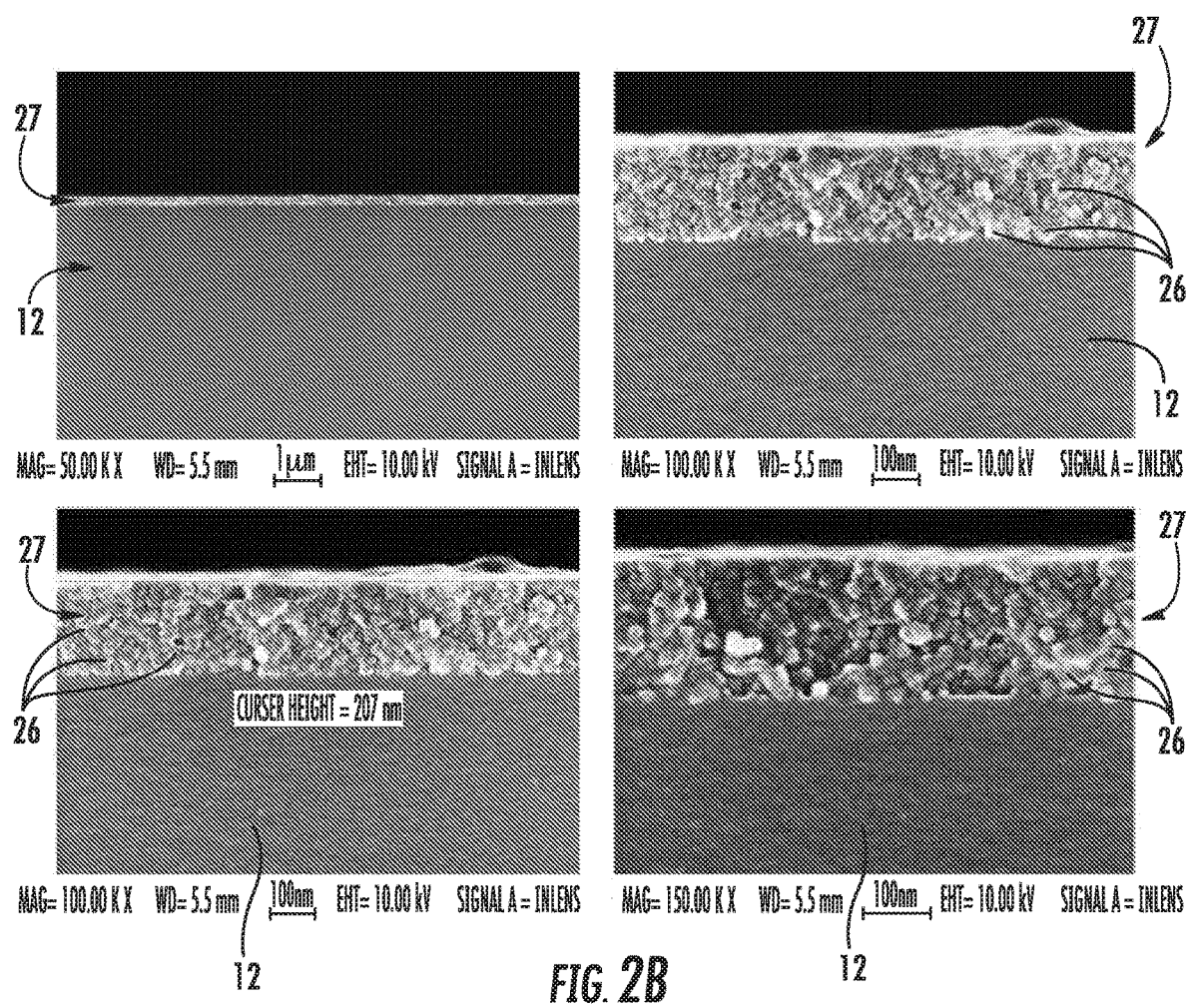
FIG. 2B shows an array of images at different magnification levels of an aggregate particle layer according to an exemplary embodiment.

Referring to FIG. 2B, particles 26 may form an aggregate particle film layer 27. In the aggregate morphology, smaller particle aggregates can themselves form larger aggregates culminating in a thicker dense film suitable for laser welding (see FIG. 2B).

Particles 26 are formed from any inorganic material or combination of inorganic materials that are capable of absorbing incident laser energy (e.g., ultraviolet UV laser energy) in order to cause the bonding to generate the weld between the substrates as discussed below. In specific embodiments, particles 26 may be formed from one or more glass or inorganic materials, such that particle layer 24 absorbs at least 15% of incident laser energy in at least one of the ultraviolet, infrared or visible spectrums. In a specific embodiment, particle layer 24 absorbs at least 50% of incident laser energy in at least one of the ultraviolet, infrared or visible spectrums. In specific embodiments, particles 26 are formed from at least one of a low melting glass (LMG) having a Tg less than 600 degrees C., a borosilicate glass material, and an alumino-silicate glass material. In various embodiments, particles 26 may be a variety of materials (for example, ZnO, $TiO_2$, $SnO_2$, bi-borates, etc.) whose particle film layer is capable of absorbing laser energy to formation of a weld.

In various embodiments, particles 26 include a material that absorbs any suitable wavelength of laser energy, including ultraviolet spectrum laser energy, infrared spectrum laser energy, near infrared spectrum laser energy and visible spectrum laser energy. In specific embodiments, particles 26 include a material that absorbs in the 200-410 nm wavelength range, and in other embodiments, particles 26 includes a material that absorbs in the 800-1900 nm wavelength range. In some embodiments, particles 26 absorb at a non-visible spectrum of laser 30 while being transparent/translucent to visible light. In a specific embodiment, the material of particles 26 and of substrates 12 and 14 are transparent to light within a wavelength range of 420 nm to 750 nm. In some other embodiments, particles 26 absorb at a non-visible spectrum of laser 30 while being opaque to visible light.

Figure 3:
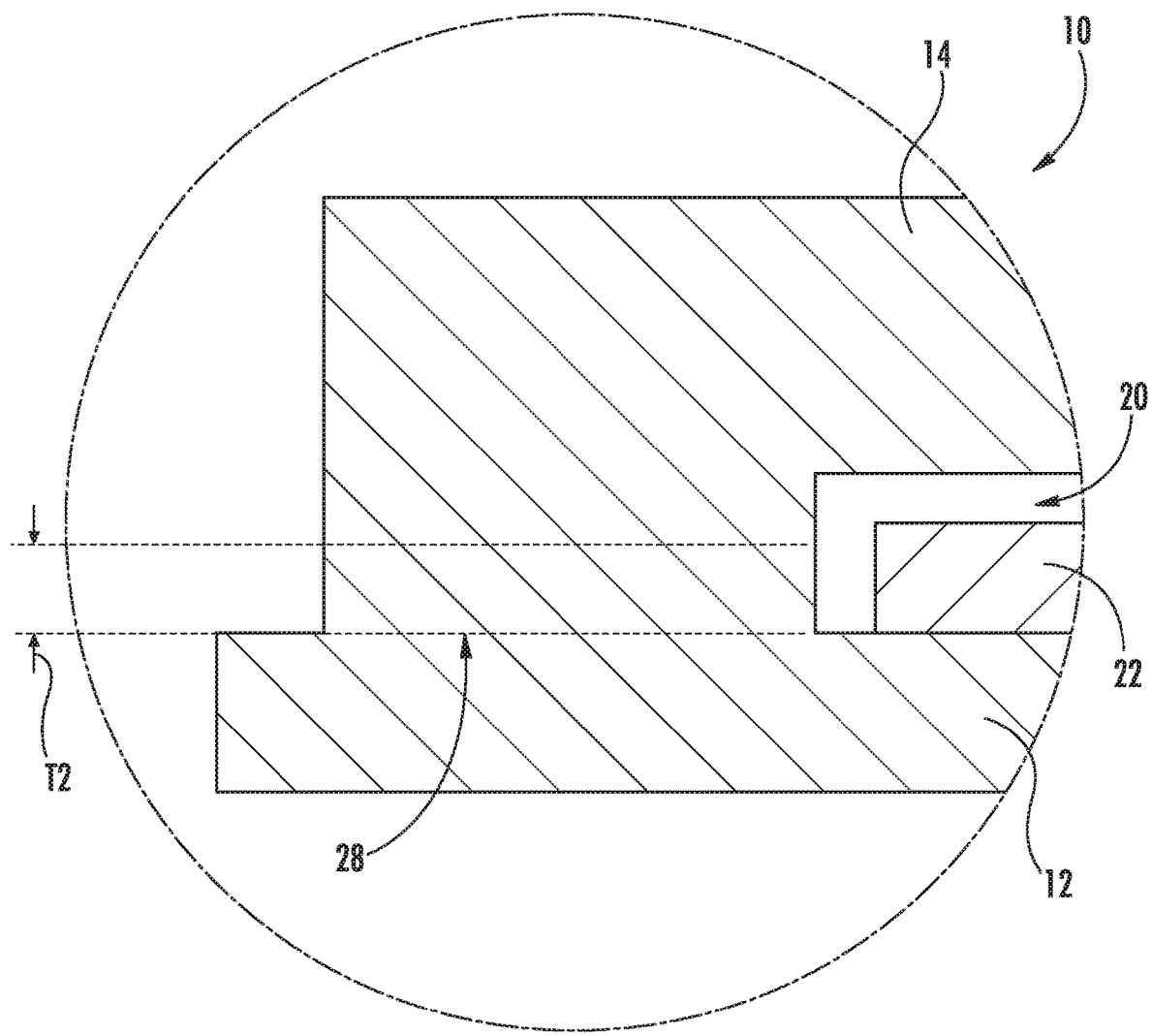
FIG. 3 shows a side cross-sectional view of a sealed device housing including a thin particle initiated laser weld according to an exemplary embodiment.

As will be understood, conventional frit sealed electronic devices include a relatively thick (e.g., typically between 5 and 20 μm) bead of frit (which is a combination of LMG particles and negative CTE particles) that is melted between opposing substrates such that adhesive bonds are formed between the frit and both of the opposing substrates, and in this type of arrangement, the frit material adhesively bonded between the substrates acts to form the hermetic seal around an electronic device, such as an OLED. In contrast to these typical frit sealed devices, FIG. 3 shows device 10 following laser weld formation in which a cohesive, particle-initiated laser weld zone 28 is shown according to an exemplary embodiment. As shown in FIG. 3, weld zone 28 surrounds chamber 20 and is formed from portions of substrates 12 and 14 that are joined directly together by directing a laser 30 at the location of particle layer 24. In various embodiments, because the weld structure discussed herein is formed almost entirely from the materials of substrates 12 and 14, the material composition within weld zone 28 is substantially the same as the material composition of substrates 12 and 14 outside of weld zone 28. In specific embodiments, the material composition with weld zone 28 is at least 1% the same, and specifically at least 90% the same as the composition of substrates 12 and 14 outside of the weld. In such embodiments, the relatively small amount of the material of particles 26 are effectively diluted via interaction with laser 30 and is dispersed or surrounded by the material of substrates 12 and 14 as weld zone 28 is formed.

In various embodiments, the joining of substrates 12 and 14 is accomplished via melting that occurs via the absorption of laser energy by particle layer 24. In other embodiments, substrates 12 and 14 are joined together by a weld formed by one or both of the substrates attaining viscoelastic flow from increased temperatures (e.g., laser induced temperatures) and being thermo-compressed together. In other embodiments, weld zone 28 may be a diffusion weld and/or a weld formed where the melting point of one or both of the substrates is exceeded. In various embodiments, within laser weld zone 28, the fictive temperature of the material of substrates 12 and 14 is changed relative to the fictive temperature of the material of substrates 12 and 14 outside of laser weld zone 28. In specific embodiments, within laser weld zone 28, the fictive temperature of the material of substrates 12 and 14 is greater than the fictive temperature of the material of substrates 12 and 14 outside of laser weld zone 28. In specific embodiments, within laser weld 28, the local density of the material of substrates 12 and 14 is less than the density of the material of substrates 12 and 14 outside of laser weld 28. In specific embodiments, within laser weld 28, the elastic modulus of the material of substrates 12 and 14 is substantially different than the elastic modulus of the material of substrates 12 and 14 outside of laser weld 28. In one embodiment, laser weld zone 28 can be reinforced with a perimeter seal surrounding active component 22.

In various embodiments, substrates 12 and 14 may be formed from any suitable material including various glass or glass-ceramic materials that allow for formation of weld zone 28. In specific embodiments, substrates 12 and 14 are formed from at least one of a soda-lime glass material, an alumino-silicate glass material, a phosphate glass material, a borosilicate glass material, and alumina, or aluminum nitride glass-ceramic material. In specific embodiments, substrates 12 and 14 are translucent/transparent (e.g., 60%, 70%, 80%, 90% transmission) allowing laser 30 to pass through at least one of the substrates and to interact with particle layer 24. In a specific embodiment, the material of the first and second substrates absorbs less than 5% of incident light in at least one of the ultraviolet, infrared or visible spectrums.

In various embodiments, it is believed that the cohesive weld structure of laser weld zone 28 provides stronger bonding with a lower overall thickness as compared to the adhesive-based bonding structure of a traditional thick frit sealed electronic device. In various embodiments, the tensile strength of the laser welds discussed herein is greater than 10 MPa, specifically greater than 15 MPa and more specifically is greater than 30 MPa. In particular embodiments, the tensile strength of the laser welds discussed herein is between 15 MPa and 150 MPa, specifically is between 100 MPa and 150 MPa, and more specifically is about 120 MPa (e.g., 120 MPa plus or minus 10%). Applicant believes that such laser welds are substantially stronger than conventional frit based seals that typically have tensile strengths of 10 MPa or less.

In various embodiments, the thickness of weld zone 28 is believed to be substantially lower than the thickness of a traditional frit seal. As shown in FIG. 3, weld zone 28 has a thickness T2, and in various embodiments, T2 is less than or equal to 1.5 μm. In various embodiments, the dimensions of laser weld zone 28 (e.g., the width and/or thickness of the weld) can be determined by a survey of the local density distribution, of fictive temperature distribution, of stress profiles, modulus, etc. in the vicinity of weld zone 28.

As an example, in some embodiments, laser 30 is a 355 nm laser with a power between 0.1 W and 1.0 W, and specifically, 0.1 W and 0.5 W. In a specific embodiment, laser 30 is a 355 nm laser with a power of 0.6 W and a scanning speed of between 10 mm/s and 50 mm/s, and specifically of 25 mm/s, and particle layer 24 is an LMG particle layer. In various specific embodiments, the lasers, processes and materials may be any of those disclosed in U.S. Publication No. 2015/0027168 (U.S. application Ser. No. 14/271,797, filed May 7, 2014), which is incorporated herein by reference in its entirety.

As used herein, a hermetic seal and/or hermetically sealed device is one which, for practical purposes, is considered substantially airtight and substantially impervious to moisture and/or oxygen. By way of example, laser welds discussed herein can be configured to limit the transpiration (diffusion) of oxygen to less than about $10^{-2}$ cm$^3$/m$^2$/clay (e.g., less than about $10^{-3}$ cm$^3$/m$^2$/day), and limit the transpiration (diffusion) of water to about $10^{-2}$ g/m$^2$/day (e.g., less than about $10^{-3}$, $10^{-4}$, $10^{-5}$ or $10^{-6}$ g/m$^2$/day). In such embodiments, the hermetic seal substantially inhibits air and water from contacting a protected active element, such as active device 22.

Figure 4:
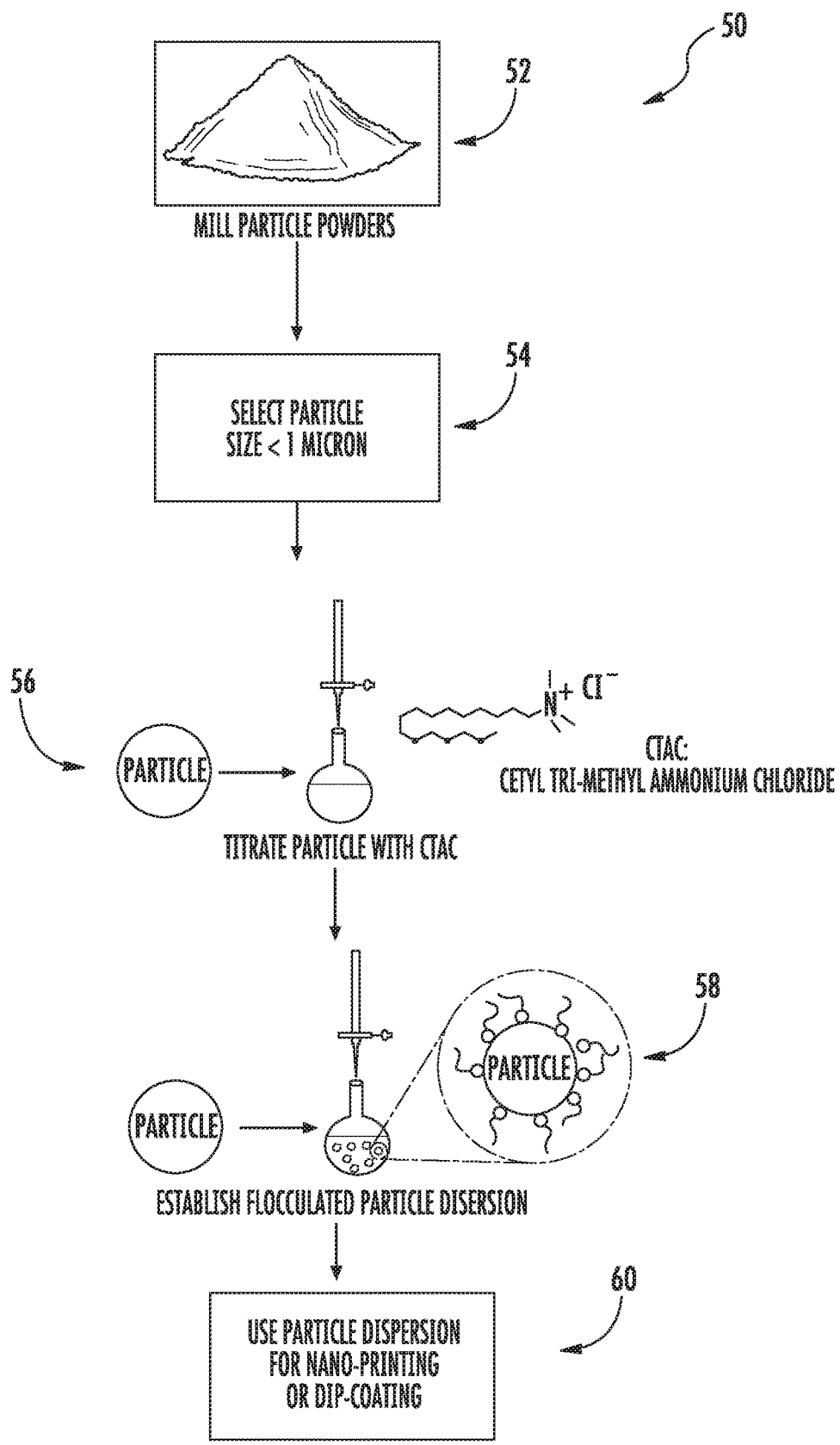
FIG. 4 shows a process for forming a particle solution according to an exemplary embodiment.

Referring to FIG. 4, a process 50 for preparing a particle material or solution that may be used to form particle layer 24, as discussed above, is shown according to an exemplary embodiment. At step 52, the particle material is milled or otherwise formed into a powder having small diameter particles, such as particles 26, discussed above. In one embodiment, small diameter particles may be formed using the methods described in Published International Patent Application No. WO2015/123254, filed on Feb. 11, 2015, which is incorporated herein by reference in its entirety. At step 54, the particles formed at step 52 are processed, sorted, filtered, etc. to select or segregate particles having diameters of less than or equal to 1 μm.

At step 56, an aqueous particle solution is prepared by titrating the selected, small diameter, particles with a surfactant solution. In one embodiment, the surfactant solution is an aqueous solution of CTAC, and in specific embodiments, a 5 wt % aqueous particle solution is prepared by titrating with a 1 wt % aqueous CTAC solution. In other embodiments, the particle solution may be an isopropanol based solution. At step 58, a fully dispersed or de-flocculated inorganic particle solution is formed by continuing the titration with the CTAC solution while monitoring the correct pH (determined by the zeta-potential) to determine when the fully dispersed solution is formed. Note that the initial use of the zeta potential is for determining the isoelectric point of the particles so that the correct pH can be used for optimizing the interaction of the particles and dispersant. As shown at step 58, the CTAC surfactant forms a structure around each particle such that the particles are fully suspended within the solution (shown schematically in FIG. 4). At step 60, the particle solution or particle ink is then applied to a substrate (such as substrate 12 or 14) to form a particle layer 24, as discussed above.

As one example, small diameter particles in an aqueous or isopropanol solution using CTAC were tested by titrating a 230 mL aqueous 5 wt % LMG particle solution with a 1 wt % aqueous CTAC solution while monitoring the zeta potential. The zeta potential serves as a useful guide to help achieve a fully dispersed particulate solution by appropriate adjustment of the CTAC concentration. For example, the initial zeta potential of −10 mV is indicative of a phosphate glass in an aqueous environment. As successive aliquots of the CTAC surfactant is added to the particle solution, a gradual colloidal dispersion of the form shown schematically at step 58 in FIG. 4 is formed. As shown at step 58, each particle is characterized by a single mono-layer of the ammonium part of CTAC decorating its negatively charged surface. Note that there are also several other polymeric materials that can be used for dispersing silicas. In one example, a solution was prepared having an effective zeta potential near 20 mV, resulting in a fully dispersed particle "ink" in a form amenable for printing close-packed particle mono or multi-layers, such as the packing arrangement shown in FIG. 2. It is believed that stable particle-CTAC dispersions typically are in the greater than ±20 mV zeta potential range.

Figure 5:
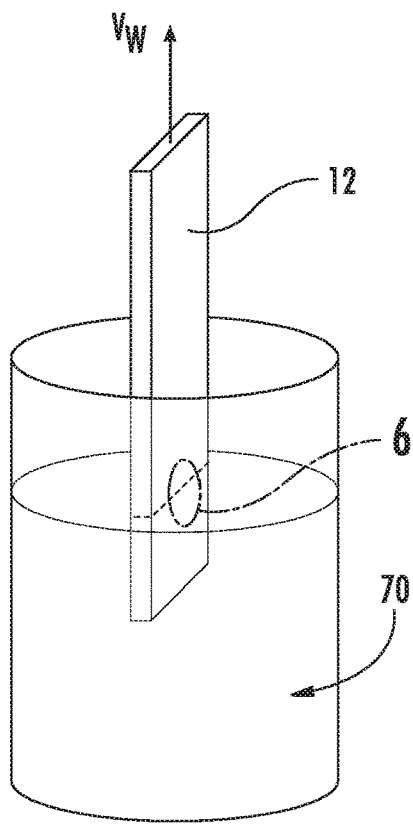
FIGS. 5 and 6 show a dip-coating process for forming a thin particle layer according to an exemplary embodiment.
Figure 6:
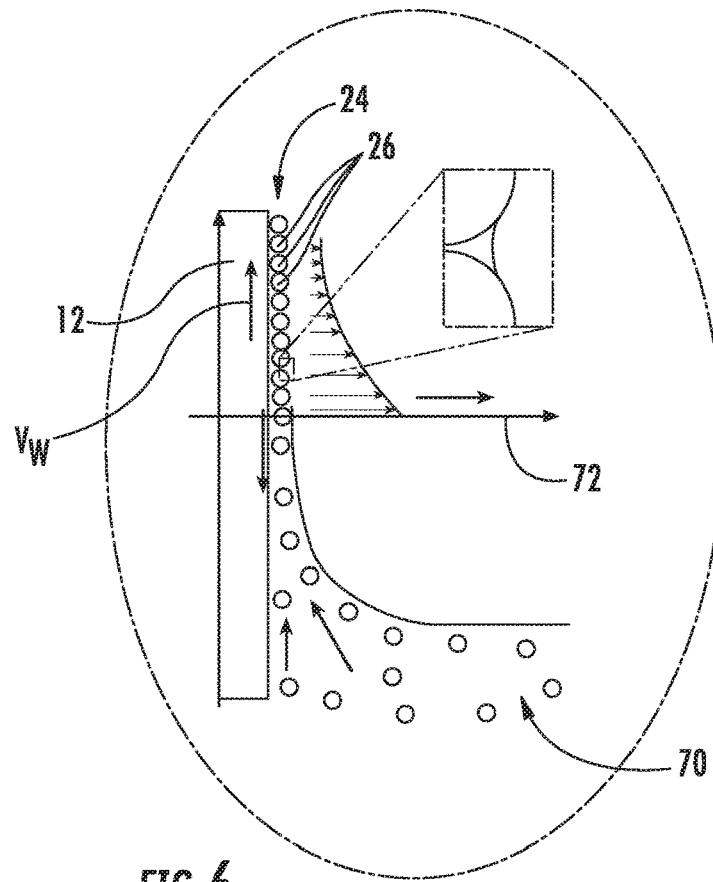

Referring to FIG. 5 and FIG. 6, a process for forming a particle layer, such as particle layer 24, on a substrate, such as substrate 12, is shown according to an exemplary embodiment. In an exemplary embodiment, the process shown in FIG. 5 and FIG. 6 forms a mono-layer of close-packed small diameter particles. In this embodiment, to form particle layer 24, substrate 12 is dipped or inserted into a colloidal particle dispersion, such as that formed by the method of FIG. 4, shown as particle solution 70. Substrate 12 is then withdrawn in the vertical direction at a constant slow speed shown in FIG. 6 as $V_w$. In various embodiments, $V_w$ is between $V_w$ is between 25 mm/minute and 500 mm/minute.

As shown in FIG. 6, the surfactant-coated particles 26 nucleate at the drying front 72 to form the ordered particle arrangement for particle layer 24 discussed herein. In this manner, the growth of particle layer 24 is in the direction opposite of $V_w$ as substrate 12 is continuously removed from solution 70. It is believed that this method of forming particle layer 24 is driven by the attractive capillary forces that drive the particles toward the formed layer once the height of the liquid film during withdrawal drops below the diameter of the surfactant-coated particle. As will be appreciated the particle application approach shown in FIGS. 5 and 6 avoids the need to apply the particle layer to the substrate in a vacuum environment, as is typically the case with thin-film deposition techniques.

Figure 7:
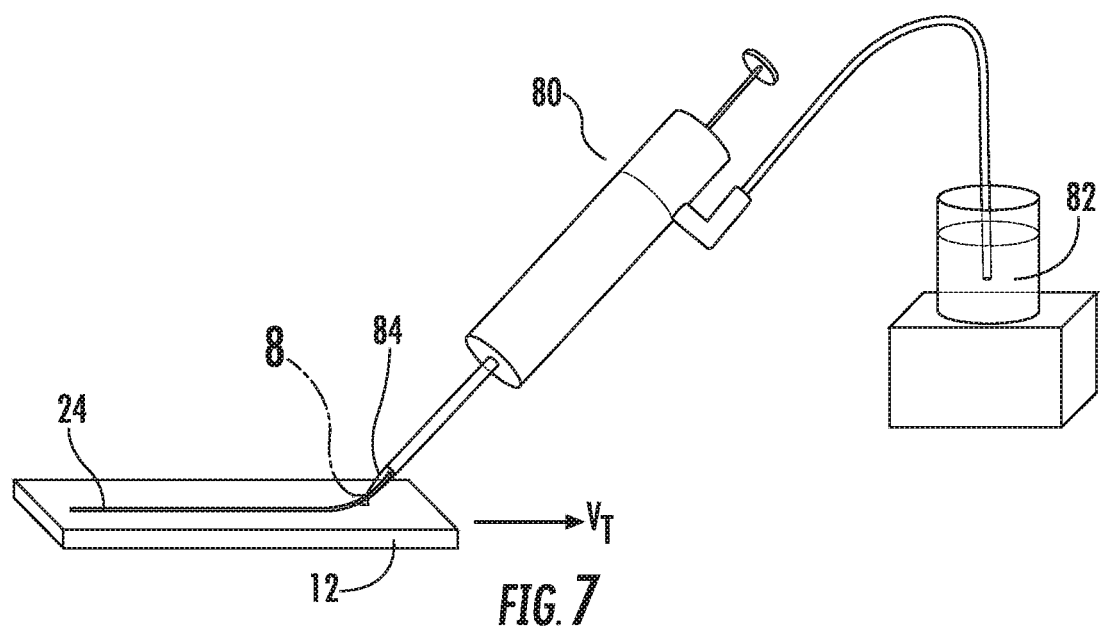
FIGS. 7 and 8 show a pen application process for forming a thin particle layer according to an exemplary embodiment.
Figure 8:
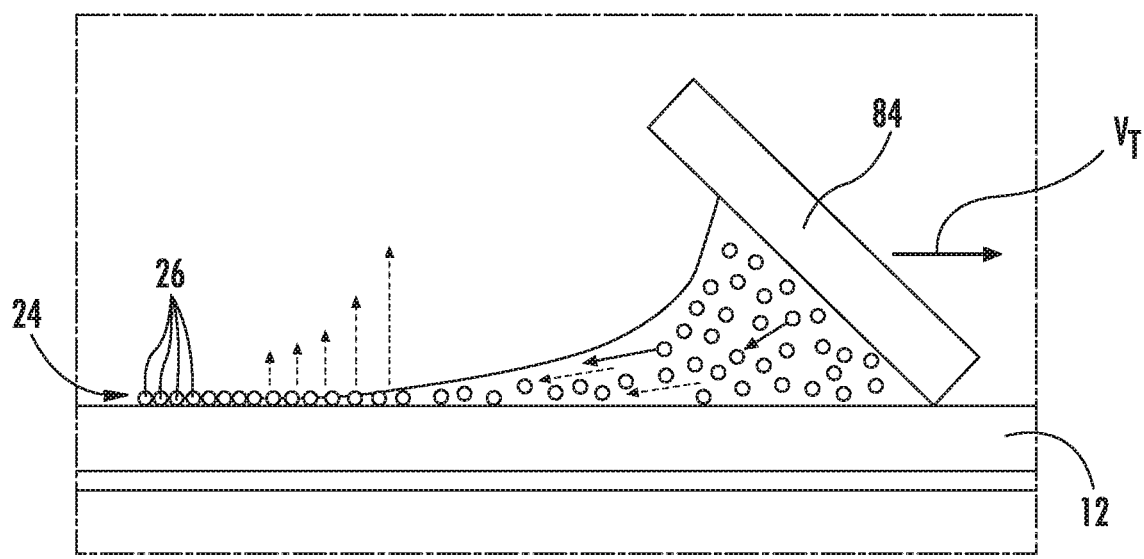

Referring to FIG. 7 and FIG. 8, a process for forming a particle layer, such as particle layer 24, on a substrate, such as substrate 12, is shown according to another exemplary embodiment. In this embodiment, an applicator, shown as dip pen 80, is configured to draw from a source of particle suspension, shown as particle solution 82. In general, dip pen 80 deposits a layer of particle solution onto substrate 12. Relative movement between pen tip 84 and substrate 12 is shown as $V_t$. Similar to the withdraw rate in FIGS. 5 and 6, $V_t$ is selected such that the surfactant-covered particles 26 are allowed to assemble in a close-packed pattern on substrate 12, as the water from the deposited particle solution evaporates. By this method, formation of either a mono layer or multi-layer particle layer 24 is shown according to an exemplary embodiment in FIG. 8.

In various embodiments, a liquid meniscus forms between pen tip 84 and substrate 12 in a manner analogous to that shown in FIG. 6. The size of the meniscus, which is controlled by relative humidity, affects the two-dimensional colloidal assembly rate, the effective tip-substrate contact area, and resolution of the applied particle layer. In other embodiments, particle layer 24 may be formed from any suitable solution or ink deposition device or process including spin coating methods, convective assembly methods, electro-deposition assembly methods, electrophoretic assembly methods, etc.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is in no way intended that any particular order be inferred. In addition, as used herein, the article "a" is intended to include one or more than one component or element, and is not intended to be construed as meaning only one.

It will be apparent to those skilled in the art that various modifications and variations can be made without departing from the spirit or scope of the disclosed embodiments. Since modifications, combinations, sub-combinations and variations of the disclosed embodiments incorporating the spirit and substance of the embodiments may occur to persons skilled in the art, the disclosed embodiments should be construed to include everything within the scope of the appended claims and their equivalents.

What is claimed is:

1. A laser weldable device housing substrate comprising:
   a first surface;
   a second surface opposite the first surface; and
   a thin inorganic particle layer supported by the first surface, the inorganic particle layer comprising a plurality of particles arranged in a layer on the first surface, the particles having an average diameter of less than or equal to 1.0 μm, and the inorganic particle layer having an average thickness of less than or equal to 5 μm;
   wherein the inorganic particle layer is formed from a mono-layer of the particles located on the first surface; and
   wherein at least a portion of the particles of the inorganic particle layer are arranged in a hexagonal close-packed arrangement on the first surface.

2. The laser weldable device housing substrate of claim 1, wherein the substrate comprises at least one of a glass material and a glass-ceramic material that has a first coefficient of thermal expansion, where the particles of the inorganic particle layer are at least one of glass particles and inorganic particles, wherein the inorganic particle layer has a second coefficient of thermal expansion, wherein the second coefficient of thermal expansion is greater than the first coefficient of thermal expansion.

3. The laser weldable device housing substrate of claim 2, wherein the difference between the second coefficient of thermal expansion and the first coefficient of thermal expansion is greater than 1%, wherein the average diameter of the particles of the inorganic particle layer is greater than or equal to 1 nm.

4. The laser weldable device housing substrate of claim 3, wherein the inorganic particle layer further comprises a surfactant material associated with the particles, the surfactant material supporting the particles in a dispersion prior to deposition on the first surface.

5. The laser weldable device housing substrate of claim 1, wherein at least a portion of the particles of the inorganic particle layer have an aggregate morphology, wherein the particles form aggregates forming a layer having a thickness of less than 5 μm.

6. The laser weldable device housing substrate of claim 1, wherein the particles of the inorganic particle layer absorb greater than 15% of incident laser energy in at least one of the ultraviolet, infrared or visible spectrums, such that the inorganic particle layer is capable of forming a laser weld between the first surface and a surface of a second substrate.

7. The laser weldable device housing substrate of claim 6, wherein the particles of the inorganic particle layer are formed from at least one of a low melting glass (LMG) having a Tg less than 600 degrees C., a borosilicate glass material, an alumino-silicate glass material, ZnO, $TiO_2$, $SnO_2$, and a bi-borate material, wherein the substrate comprises a glass or glass-ceramic material that is at least one of a soda lime glass material, an alumino-silicate glass material, a borosilicate glass material, a phosphate glass material, and alumina, or aluminum nitride glass-ceramic material.

8. A sealed electronic device housing comprising:
   a first substrate having a first surface;
   a second substrate having a second surface facing the first surface; and
   an inorganic particle-initiated laser weld joining the first surface to the second surface using a mono-layer of inorganic particles, wherein at least a portion of the inorganic particles are arranged in a hexagonal close-packed arrangement on the first surface, wherein the laser weld surrounds a chamber defined between the first substrate, the second substrate and the laser weld, wherein the laser weld has a maximum thickness of less than 5 um and is formed from materials of the first and second substrates joined together.

9. The sealed electronic device housing of claim 8, wherein the first and second substrates are glass or glass-ceramic substrates, wherein the inorganic particle-initiated laser weld is formed from a laser absorbing inorganic particle layer including a glass or inorganic particulate material that is different from the material of at least one of the first substrate and the second substrate.

10. The sealed electronic device housing of claim 9, wherein the material of the inorganic particle layer absorbs greater than 15% of incident light in at least one of the ultraviolet, infrared or visible spectrums, wherein the material of the first and second substrates absorbs less than 5% of incident light in at least one of the ultraviolet, infrared or visible spectrums.

11. The sealed electronic device housing of claim 10, wherein the material of the inorganic particle layer is at least one of a low melting glass (LMG) having a Tg less than 600 degrees C., a borosilicate glass material, an alumino-silicate glass material, ZnO, $TiO_2$, $SnO_2$, and a bi-borate material, and the material of the inorganic particle layer is surrounded by the material of the first and second substrates within the laser weld.

12. The sealed electronic device housing of claim 11, wherein the first and second substrates each comprise a glass or glass-ceramic material that is at least one of a soda lime glass material, an alumino-silicate glass material, a borosilicate glass material, and alumina, or aluminum nitride glass-ceramic material.

13. The sealed electronic device housing of claim 8, wherein the composition of material within the laser weld is at least 90% the same as the material composition of at least one of the first substrate and the second substrate.

14. The sealed electronic device housing of claim 8, wherein the inorganic particle-initiated laser weld forms a hermetic seal between the first and second substrates surrounding the chamber, wherein an active device is located within the chamber.

15. A method of forming a hermetically laser sealable device housing comprising:
   providing a first substrate having a first surface; and
   applying an inorganic particle layer to the first surface, the inorganic particle layer comprising a plurality of particles arranged in a layer on the first surface, the particles having an average diameter of less than 1.5 µm and the inorganic particle layer having an average thickness of less than 5 µm, wherein the particles are at least one of a glass material and an inorganic material;
   wherein the inorganic particle layer is formed from a mono-layer of the particles located on the first surface; and
   wherein at least a portion of the particles of the inorganic particle layer are arranged in a hexagonal close-packed arrangement on the first surface.

16. The method of claim 15, wherein applying the inorganic particle layer on the first surface comprises applying an inorganic particle solution onto the first surface.

17. The method of claim 15, wherein applying the inorganic particle layer comprises at least one of dip coating the first substrate in an aqueous inorganic particle solution and printing an aqueous inorganic particle solution onto the first surface.

18. The method of claim 17, wherein the aqueous inorganic particle solution includes a surfactant material bonded to the particles such that the particles form a dispersion within the aqueous solution.

19. The method of claim 15, further comprising:
   providing a second substrate having a second surface;
   positioning the second substrate such that the first surface of the first substrate faces the second surface, and the second surface contacts the inorganic particle layer; and
   directing a laser at the inorganic particle layer, wherein the inorganic particle layer absorbs energy from the laser forming a cohesive weld between the first surface and the second surface;
   wherein the cohesive weld surrounds a chamber defined by opposing portions of the first surface and the second surfaces;
   wherein the glass material of the particles of the inorganic particle layer is at least one of a low melting glass (LMG) having a Tg less than 600 degrees C., a borosilicate glass material, an alumino-silicate glass material, ZnO, $TiO_2$, $SnO_2$, and a bi-borate material, wherein the laser is at least one of an ultraviolet, infrared and visible spectrum laser, and the particles of the inorganic particle layer absorb more than 15% of the energy of the laser directed at the inorganic particle layer.

* * * * *

UNITED STATES PATENT AND TRADEMARK OFFICE
CERTIFICATE OF CORRECTION

PATENT NO. : 10,497,898 B2
APPLICATION NO. : 15/778333
DATED : December 3, 2019
INVENTOR(S) : Heather Debra Boek et al.

It is certified that error appears in the above-identified patent and that said Letters Patent is hereby corrected as shown below:

On the Title Page

In Column 2, item (56), OTHER PUBLICATIONS, Line 1, delete "Fo" and insert -- Of --, therefor.

In the Claims

In Column 10, Line 57, Claim 8, delete "5 um" and insert -- 5μm --, therefor.

Signed and Sealed this
Third Day of March, 2020

Andrei Iancu
*Director of the United States Patent and Trademark Office*